United States Patent
Okamoto et al.

(10) Patent No.: US 7,855,093 B2
(45) Date of Patent: Dec. 21, 2010

(54) SEMICONDUCTOR LASER DEVICE AND METHOD OF MANUFACTURING THE SAME

(75) Inventors: Kaoru Okamoto, Yokohama (JP); Ryu Washino, Chigasaki (JP); Kazuhiro Komatsu, Yokohama (JP); Yasushi Sakuma, Tokyo (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 12/572,720

(22) Filed: Oct. 2, 2009

(65) Prior Publication Data
US 2010/0022043 A1    Jan. 28, 2010

Related U.S. Application Data

(62) Division of application No. 11/708,135, filed on Feb. 20, 2007, now abandoned.

(30) Foreign Application Priority Data

Apr. 27, 2006   (JP) .............................. 2006-122777

(51) Int. Cl.
*H01L 21/30* (2006.01)
(52) U.S. Cl. ............ 438/32; 257/E21.211; 257/E33.067
(58) Field of Classification Search .................. 438/32; 257/E21.211, E33.067
See application file for complete search history.

(56) References Cited

U.S. PATENT DOCUMENTS

| | | | |
|---|---|---|---|
| 4,888,784 A | 12/1989 | Hirata | |
| 5,633,193 A | 5/1997 | Baillargeon et al. | |
| 5,838,854 A * | 11/1998 | Taneya et al. | 385/50 |
| 5,872,022 A | 2/1999 | Motoda et al. | |
| 6,477,191 B1 | 11/2002 | Okada et al. | |
| 6,608,855 B1 | 8/2003 | Hwang et al. | |
| 7,016,391 B2 * | 3/2006 | Takahashi | 372/96 |
| 2002/0003769 A1 | 1/2002 | Yamada et al. | |
| 2003/0170924 A1 * | 9/2003 | Takiguchi | 438/29 |

FOREIGN PATENT DOCUMENTS

| | | |
|---|---|---|
| JP | 62-150794 | 7/1987 |
| JP | 09-008396 | 1/1997 |

OTHER PUBLICATIONS

European Search Report issued in European Patent Application No. EP 07 00 3455.8 dated Nov. 18, 2009.

* cited by examiner

*Primary Examiner*—Trung Dang
(74) *Attorney, Agent, or Firm*—McDermott Will & Emery LLP

(57) ABSTRACT

A method of manufacturing semiconductor laser device capable of reducing κL, with manufacturing restrictions satisfied, is provided. In a distributed-feedback or distributed-reflective semiconductor laser device, immediately before burying regrowth of a diffraction grating, halogen-based gas is introduced to a reactor, and etching is performed on the diffraction grating so that each side wall has at least two or more crystal faces and a ratio of length of an upper side in a waveguide direction to a bottom side parallel to a (100) surface is 0 to 0.3. And, a reactive product formed on side surfaces of the diffraction grating and in trench portions between stripes of the diffraction grating at an increase of temperature for regrowth is removed. Therefore, the diffraction grating with reduced height and a sine wave shape is obtained, thereby κL of the device is reduced. Thus, an oscillation threshold and optical output efficiency can be improved.

3 Claims, 4 Drawing Sheets

SEMICONDUCTOR LASER DEVICE AND METHOD OF MANUFACTURING THE SAME

CROSS-REFERENCE TO RELATED APPLICATION

The present application is a Divisional of U.S. patent application Ser. No. 11/708,135, filed on Feb. 20, 2007 now abandoned, claims priority from Japanese patent application No. JP 2006-122777 filed on Apr. 27, 2006, the entire contents of each of which are hereby incorporated by reference into this application.

TECHNICAL FIELD OF THE INVENTION

The present invention relates to semiconductor laser devices and manufacturing techniques thereof, and particularly relates to techniques effective when applied to distributed-feedback or distributed-reflective semiconductor laser devices for optical transmission apparatuses or information storage apparatuses, and a method of manufacturing thereof.

BACKGROUND OF THE INVENTION

For example, as a light source for optical transmission apparatus or information storage apparatus, a distributed feedback (DFB) laser using a refractive-index-modulation diffraction grating, which has narrow spectrum and allows single mode oscillation, is mainly adopted. In a DFB laser, light output and modulation characteristic significantly change according to $\kappa L$, product of a coupling coefficient $\kappa$ of light diffracted in a waveguide direction and an oscillator length L. Therefore, in designing and manufacturing laser devices, it is important to set $\kappa L$ at a desired value. Here, the coupling coefficient $\kappa$ is determined by height of the diffraction grating, distance from an active layer, and difference in refractive index between a diffraction grating layer and a buried layer (clad layer). In particular, the coupling coefficient $\kappa$ largely depends on the height of the diffraction grating.

A conventional process of forming a diffraction grating is described below. On an n-InP substrate, an n-InP first clad layer, an n-InGaAlAs first optical guide layer, an InGaAlAs active layer, a p-InGaAlAs second optical guide layer, a p-InP spacer layer, a p-InGaAsP diffraction grating layer, and a p-InP cap layer are formed through crystal growth, such as metal organic chemical vapor deposition (MOCVD). In order to increase a carrier confinement effect, the InGaAlAs active layer includes a multiple quantum well (MQW) having an InGaAlAs barrier layer and InGaAlAs well layer laminated in a periodic structure.

Furthermore, on the p-InP cap layer, an insulating film, such as a silicon dioxide ($SiO_2$) film or a silicon nitride (SiN) film, is formed. Then, through photolithography and interference exposure or electron beam (EB) exposure, a striped pattern is formed in a direction perpendicular to a waveguide. The insulating film is removed through dry etching with fluorinated gas or wet etching with hydrofluoric acid solution, using the resist pattern as a mask. Then, the resist pattern is removed with solvent. Using the insulating film as a mask, the p-InP cap layer and the p-InGaAsP diffraction grating layer are removed through dry etching or wet etching to form a rectangular diffraction grating. Next, a p-InP second clad layer regrowth is performed through MOCVD or the like.

SUMMARY OF THE INVENTION

Meanwhile, in recent years, achievement of lasers with high outputs staring at its uncooled operation has been desired not only in semiconductor laser devices for information systems but also in those for optical transmission. Lengthening an oscillator and reducing $\kappa$ in association with the lengthening are took up as technical problems.

As has been described above, $\kappa$ depends on the height of the diffraction grating. Therefore, in order to reduce $\kappa$, the height of the diffraction grating has to be lowered. However, if the height of the diffraction grating is too low, large variations in yield of device characteristics, caused by deterioration in etching controllability over the diffraction grating layer or loss due to thermal decomposition at increase in temperature in burying regrowth or the like, may occur. In conventional process, to avoid these problems, the height of the diffraction grating after etching has to be 15 nm or higher. To reduce the $\kappa$ with the manufacturing restrictions in the height of diffraction grating satisfied, the height of the diffraction grating after etching must be 20 nm to 30 nm which includes sufficient margin in process controllability, and must be lowered immediately before burying regrowth. In one means for this purpose, the height can be lowered by actively using thermal decomposition at increase of temperature. In this case, however, mass transport of the thermally-decomposed layer to trench portions of the diffraction grating produces reaction product. The product is low in crystallinity and may cause deterioration of laser device characteristics.

A theoretical value of $\kappa L$ is varied depending on whether the diffraction grating has a rectangular shape or a sine wave shape, and value of $\kappa$ in a diffraction grating having a sine wave shape can be reduced. FIG. 5 depicts simulation results of a relation between the height of the diffraction grating and $\kappa L$ depending on a difference in shape of the diffraction grating. Note that $\kappa L$ is relative value. It is assumed herein that a composition wavelength ($\lambda$) of the InGaAsP diffraction grating layer is 1.15 µm, and the oscillator length (L) is 500 µm. A primary component in a result of Fourier transform of a cross-section shape of the diffraction grating in the waveguide direction considered as a periodic waveform affects the magnitude of $\kappa L$. Therefore, such a phenomenon as depicted in the drawing occurs. According to this result, by forming the diffraction grating in a sine wave shape, $\kappa L$ can be reduced by 21.5% ($\pi/4$) compared with the case of a rectangular shape. Usually, a diffraction grating is formed through dry etching or wet etching. In this case, a shape of the diffraction grating become rectangular, and it is difficult to form a sine wave shape through etching. This sine wave shape can be formed through thermal decomposition at increase of temperature in burying regrowth. In this case, however, the above-mentioned problem occurs due to mass transport.

As has been descried above, in the conventional semiconductor laser device manufacturing technology, the lower limit of height of the diffraction grating is determined by the restrictions in the diffraction grating forming process, thereby it is difficult to reduce the value of $\kappa$. Also, a reactive product is formed on side surfaces and the trench portions of the diffraction grating in a process of an increase of temperature in burying regrowth of the diffraction grating, and causes deterioration of oscillation threshold and optical output efficiency of the device.

An object of the present invention is to overcome the above-described problems, and to provide a semiconductor laser device manufacturing technology capable of reducing κL with manufacturing restrictions satisfied.

The above and other objects as well as novel features of the present invention will be readily apparent from the description of the specification and accompanying drawings.

The outline of a representative one of the inventions to be disclosed in the present application is briefly explained as below.

The present invention is applied to a distributed-feedback or distributed-reflective semiconductor laser device having diffraction gratings formed in stripes perpendicular to a waveguide direction, and characterized by that each diffraction grating has side walls each having at least two or more crystal faces, and a ratio of length of an upper side to a bottom side of the diffraction grating, in a waveguide direction parallel to a (100) surface, is 0 to 0.3.

Furthermore, the diffraction grating is formed of III-V family compound semiconductor layer including at least one of In, Ga, As, and P elements.

Still further, immediately before burying regrowth of the diffraction grating, halogen-based gas is introduced to a reactor, and etching process is performed to the diffraction grating to have the above-described shape. And a reactive product, formed on side surfaces of the diffraction grating and in trench portions between stripes at an increase of temperature in regrowth, is removed.

The effects achieved by a representative one of the inventions to be disclosed in the present application is briefly explained as below.

According to the present invention, in the semiconductor laser device having the diffraction grating, a value of κL can be reduced with manufacturing restrictions satisfied. Furthermore, with an effect that the reactive product deteriorated in crystallinity on a regrowth surface is removed, an improvement of the optical output efficiency of the semiconductor laser device and a reduction of oscillation threshold can be achieved.

DESCRIPTION OF THE PREFERRED EMBODIMENTS

Embodiments according to the present invention are described in detail below based on the drawings. Here, for description of the embodiments, in all drawings, the same components are provided with the same symbols, and are not repeatedly described herein.

Concept of the Embodiments

In the present embodiment, in order to reduce the value of κ, as a first means, the diffraction grating after regrowth of a second clad layer is made to have a sine wave shape. Ideally, the sine wave shape is represented by a perfect sine curve. In actuality, however, the sine wave shape is in a state that a rectangular shape remains to some extent.

Figure 1:
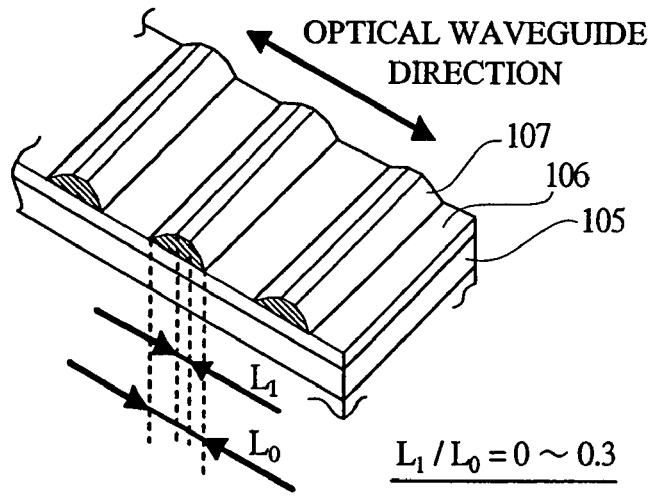
FIG. 1 is a drawing describing a diffraction grating having a sine wave shape in a semiconductor laser device according to a preferred embodiment of the present invention.

Here, as parameters that represent a sine wave shape, as shown in FIG. 1, a ratio ($L_1/L_0$) of an upper side ($L_1$) to a bottom side ($L_0$) parallel to a (100) surface in diffraction gratings (diffraction grating layers 107), which formed in stripes perpendicular to a optical waveguide direction have side walls each having at least two or more crystal faces, is defined. If $L_1/L_0$ is 1, the shape of the diffraction grating is a square. If $L_1/L_0$ is 0, the shape is a triangle. If $L_1/L_0$ is equal to or smaller than 0.3, the shape can nearly approximate to a sine wave. Therefore, it can be said that the sine wave shape is achieved when $L_1/L_0$ is 0 to 0.3.

To realize this first means, in-situ vapor phase etching introducing halogen-based gas to a reactor is performed after setting the height of the diffraction grating after dry and wet etching at 20 to 30 nm which has sufficient process controllability and increasing the temperature to a regrowth temperature of a clad layer.

Figure 2:
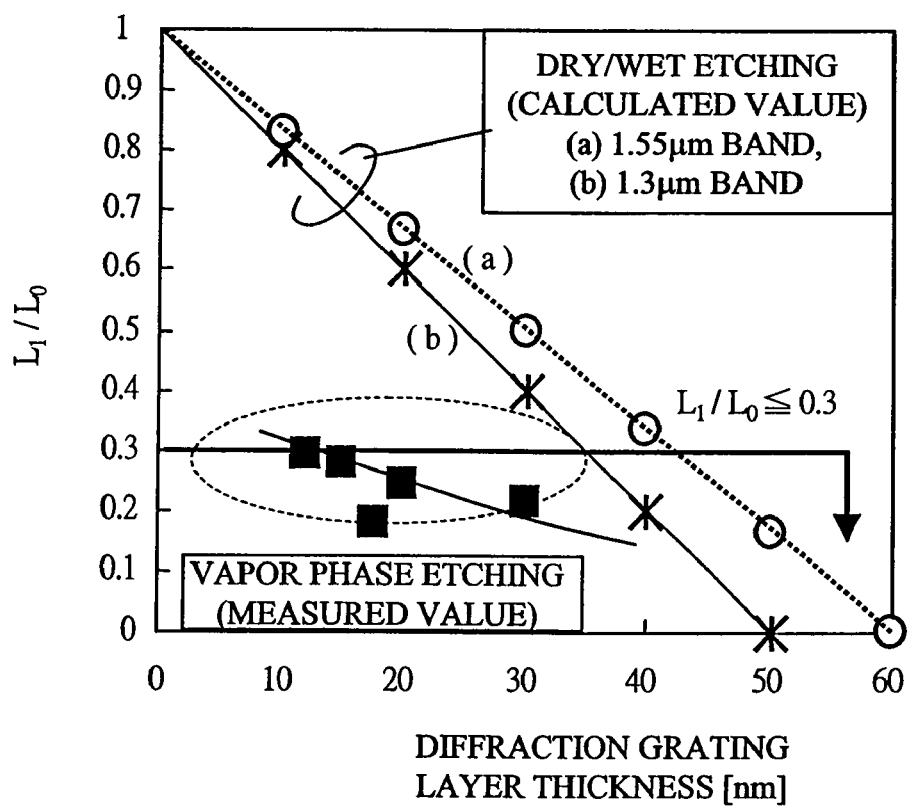
FIG. 2 is a drawing describing a relation between a thickness of diffraction grating layer and $L_1/L_0$ corresponding to an etching method in the semiconductor laser device according to a preferred embodiment of the present invention.

As shown in FIG. 2, if the diffraction grating is formed through dry and wet etching, the height of the diffraction grating has to be 35 nm to 45 nm to achieve $L_1/L_0$ equal to or smaller than 0.3 attaining a sine wave shape. With that height, the value of κL becomes larger. The reason for this relation is that since only one crystal face appears through anisotropic wet etching, the relation is uniquely determined by the height of the diffraction grating layer and the bottom side length.

By contrast, when vapor phase etching is applied, two or more crystal faces appear by etching the side walls of the diffraction grating layer. Therefore, even with the height of 15 nm to 30 nm, $L_1/L_0$ can be equal to or smaller than 0.3. With this scheme, the thickness of diffraction grating after burying regrowth is reduced to 15 nm or lower, which has been difficult with the conventional process, and a sine wave shape can be easily achieved.

Furthermore, this scheme has an effect of cleaning, that is, the reactive product formed due to mass transport at an increase of temperature is removed with halogen-based gas. Therefore, not only improving optical output by reducing κ, but also oscillation threshold current and device reliability can be improved.

As a second means, to facilitate the above-described vapor phase etching, the diffraction grating is formed of a III-V family compound semiconductor layer including at least one of In, Ga, As, and P elements.

First Embodiment

FIG. 3 is a drawing that shows a process chart of a semiconductor laser device manufacturing method according to a first embodiment of the present invention.

Figure 3A:
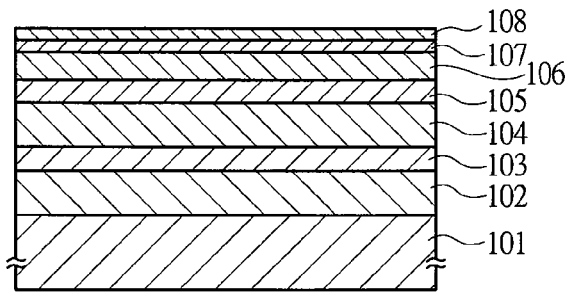
FIG. 3A is a drawing that depicts a method of manufacturing a semiconductor laser device according to a first preferred embodiment of the present invention.

On an n-InP substrate 101, an n-InP first clad layer 102, an n-InGaAlAs first optical guide layer 103, an InGaAlAs active layer 104, a p-InGaAlAs second optical guide layer 105, a p-InP spacer layer 106, a p-InGaAsP diffraction grating layer 107, and a p-InP cap layer 108 are laminated through MOCVD (FIG. 3A). To enhance a carrier confinement effect, the InGaAlAs active layer 104 has an MQW configuration consisted of an InGaAlAs barrier layer and InGaAlAs well layer. Also, in consideration of controllability over a process of forming a diffraction grating, the diffraction grating layer is made to have a film thickness of 25 nm.

Figure 3B:
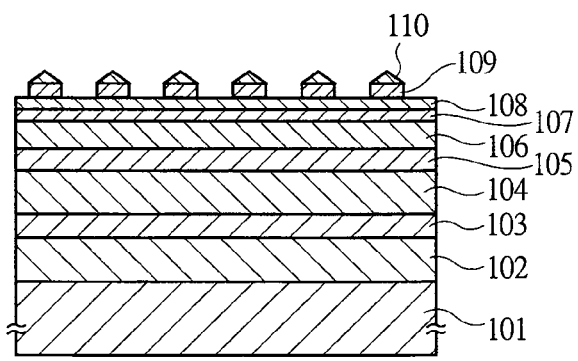
FIG. 3B is a drawing that depicts a method of manufacturing a semiconductor laser device according to a first preferred embodiment of the present invention.

Next, through CVD, an insulating film 109, such as a silicon dioxide ($SiO_2$) film or a silicon nitride (SiN) film and the like, is formed. After a resist film 110 is applied, stripes with a period of approximately 200 nm in a direction perpendicular to a waveguide is formed through EB exposure or interference exposure. Using this resist film 110 as a mask, portions of the insulating film 109 at openings are then removed through chemical etching. Chemical etching may be either one of wet etching using hydrofluoric acid mixed solution and dry etching using fluorinated gas (FIG. 3B).

Figure 3C:
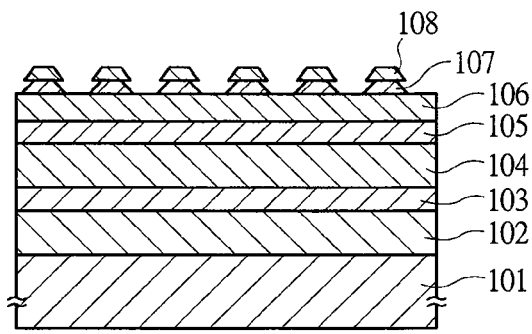
FIG. 3C is a drawing that depicts a method of manufacturing a semiconductor laser device according to a first preferred embodiment of the present invention.

Then, after removing the resist film 110 with solvent, portions of the p-InP cap layer 108 and the p-InGaAsP diffraction grating layer 107 at openings are removed through dry etching using the insulating film 109 as a mask. By using dry etching, better controllability in a depth direction can be achieved compared with wet etching. Furthermore, etching is performed in a perpendicular shape from end of a mask of the insulating film. Therefore, controllability over a duty ratio of the diffraction grating is improved, and controllability over κ is also improved. Then, the insulating film 109 is removed with hydrofluoric acid mixed solution. With the process so far, a rectangular-shaped diffraction grating including the p-InP cap layer on the active layer served as a waveguide is formed (FIG. 3C).

Figure 3D:
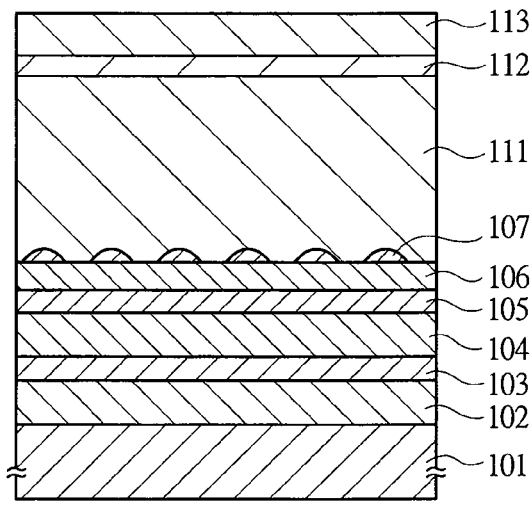
FIG. 3D is a drawing that depicts a method of manufacturing a semiconductor laser device according to a first preferred embodiment of the present invention.

Next, a surface treatment is performed on the diffraction grating formation substrate with sulfuric acid mixed solution. Then, through MOCVD, on the above-mentioned substrate, regrowth of a p-InP second clad layer 111, a p-InGaAsP first contact layer 112, and a p-InGaAs second contact layer 113 is performed. Here, immediately before regrowth of the p-InP second clad layer 111, hydrochloric acid (HCl) gas is supplied to the reactor to perform in-situ vapor phase etching on the surface of the p-InP cap layer 108 and the p-InGaAsP diffraction grating layer 107 (FIG. 3D). At etching process, temperature of the substrate surface is set at 500° C., and the etching time is set so that the height of the diffraction grating is 13 nm.

In this vapor phase etching, it is possible to remove reactive product with deteriorated crystallinity, formed on the side surfaces and trench portions of the diffraction grating due to mass transport from the p-InP cap layer 108 in the process of increasing temperature. With this, a leak current caused by such a reactive product can be suppressed and an oscillation threshold of the semiconductor laser device can be reduced. Furthermore, by partially etching the p-InGaAsP diffraction grating layer 107, the height of the diffraction grating is reduced, and a sine wave shape can be achieved. Thus, value of κ is reduced, and optical output efficiency is improved.

Here, in the present embodiment, HCl is used for etching of the diffraction grating formation substrate. Alternatively, halogen-based gas containing a halogen element, such as methyl chloride ($CH_3Cl$), carbon tetrachloride ($CCl_4$), or carbon tetrabromide ($CBr_4$), can be used.

After burying regrowth to the diffraction grating formation substrate, processes using known technology described below is performed until chip making, thus, a semiconductor laser device is manufactured.

First, stripes of approximately 2 μm made of insulating film are formed. Using the insulating film as a mask, the regrowth layer is removed through wet etching and dry etching to form an optical waveguide. After removing the stripe-shaped insulating film, an insulating film is formed again on the entire surface. Then, only a current injecting portion of the optical waveguide is opened through photolithography and etching, and then EB vapor deposition and heat treatment are performed to form a p-side electrode. After polishing the back surface of the substrate to a thickness of 100 μm, an n-side electrode is formed on the back surface through vapor deposition. After that, a wafer is cut open in a bar shape so that the oscillator length (L) is 500 μm. Then, through spattering, an end face is coated with a reflective film. Finally, the substrate is made into a chip having device with width of 200 μm, thus, a DFB semiconductor laser device is manufactured.

Through in-situ vapor phase etching using halogen-based gas immediately before regrowth of the p-InP second clad layer 111 according to the embodiment, a reactive product with deteriorated crystallinity, formed in the trench portions of the diffraction grating due to mass transport at an increase of temperature for regrowth, is removed. Furthermore a sine wave shape can be achieved with a reduced height of the diffraction grading. With this, an effect of cleaning of the regrowth interface can be achieved. Still further, by achieving reduction of κL n the semiconductor laser device, an oscillation threshold of 3 mA is reduced. According to the present embodiment, a device characteristic yield, 70% in conventional, is improved to 90%.

Second Embodiment

FIG. 4 is a drawing that shows a process chart of a semiconductor laser device manufacturing method according to a second embodiment of the present invention. In this embodiment, a method of manufacturing a semiconductor laser device, in which a diffraction grating is disposed on a lower side of an active layer, is described.

Figure 4A:
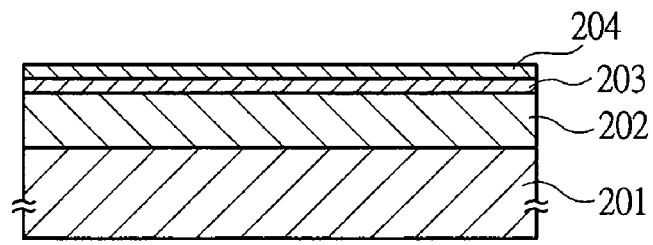
FIG. 4A is a drawing that depicts a method of manufacturing a semiconductor laser device according to a second preferred embodiment of the present invention.

On an n-InP substrate 201, an n-InP first clad layer 202, an n-InGaAlAsP diffraction grating layer 203, and an n-InP cap layer 204 are laminated through MOCVD (FIG. 4A). Here, the n-InGaAsP diffraction grating layer 203 is made to have a film thickness of 25 nm, similar to that of the first embodiment.

Figure 4B:
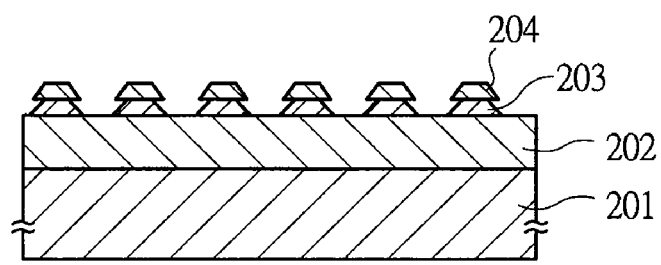
FIG. 4B is a drawing that depicts a method of manufacturing a semiconductor laser device according to a second preferred embodiment of the present invention.

Next, an insulating film is formed through CVD and, a diffraction grating is formed using a process similar to that of the first embodiment (FIG. 4B).

Figure 4C:
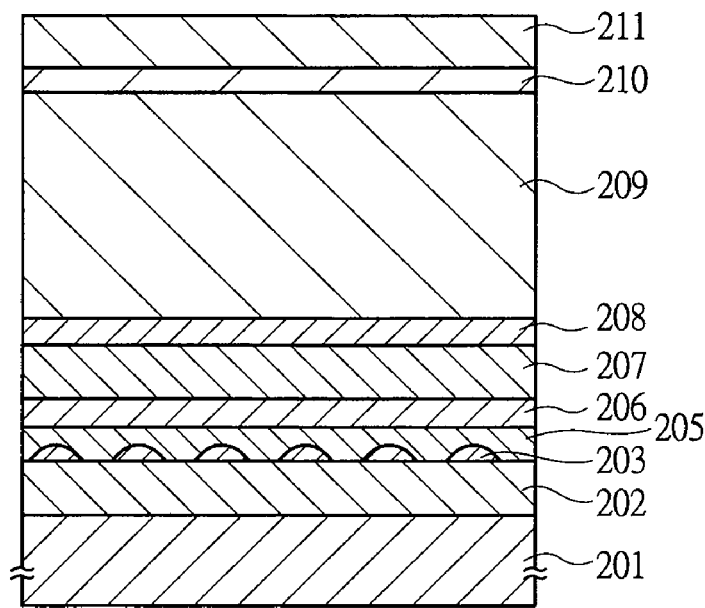
FIG. 4C is a drawing that depicts a method of manufacturing a semiconductor laser device according to a second preferred embodiment of the present invention.
Figure 5:
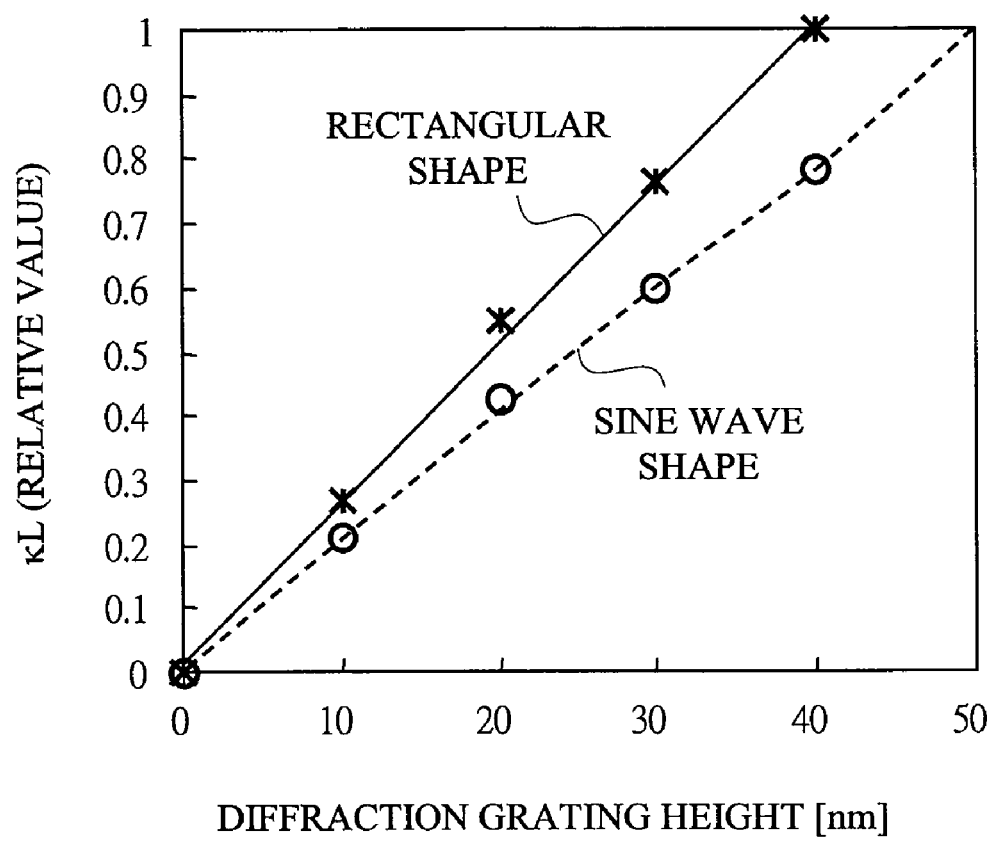
FIG. 5 is a drawing describing a relation between a height of a diffraction grating layer and κL corresponding to a shape of a diffraction grating of a semiconductor laser device in problems to be solved by the invention.

After that, through MOCVD, burying regrowth of the diffraction grating is performed. Immediately before regrowth, as with the first embodiment, halogen-based gas is supplied so that the side surfaces and the trench portions of the diffraction grating are etched. Then, an n-InP second clad layer 205, an n-InGaAlAs first optical guide layer 206, an InGaAlAs active layer 207, a p-InGaAlAs second optical guide layer 208, a p-InP third clad layer 209, a p-InGaAsP first contact layer 210, and a p-InGaAs second contact layer 211 are successively deposited (FIG. 4C).

After that, from a mesa formation process to chip making, a procedure similar to that in the first embodiment is performed. Also in the present embodiment, the device characteristic yield, 60% in conventional, is improved to 90%.

Thus, while the invention carried out by the present inventors have been specifically described based on the embodiment, the present invention is not limited to the above described embodiment, but it goes without saying that various modifications are possible within the scope of the invention.

The present invention relates to a semiconductor laser device and manufacturing technology thereof, and particularly to a technology effective when applied to a distributed-feedback or distributed-reflective semiconductor laser device for use in apparatuses for optical transmission or for information storage, and a method of manufacturing such a semiconductor laser device.

What is claimed is:

1. A method of manufacturing semiconductor laser device comprising:
    a first step of laminating a first clad layer, an active layer, and a diffraction grating layer on a semiconductor substrate through epitaxial growth;
    a second step of forming a diffraction grating by etching the diffraction grating layer; and
    a third step of performing burying regrowth of the diffraction grating through epitaxial growth on a second clad layer of different conduction type from the first clad layer,
    wherein immediately before the third step, halogen-based gas is introduced to a reactor, and etching is performed on the diffraction grating so that each side wall has at least two or more crystal faces and a ratio of length of an upper side in a waveguide direction to a bottom side parallel to a (100) surface is 0 to 0.3, and a reactive product formed on side surfaces of the diffraction grating and in trench portions between stripes of the diffraction grating at an increase in temperature for regrowth is removed.

2. The method of manufacturing semiconductor laser device according to claim 1,
    wherein in the first step, a first optical guide layer is further formed between the first clad layer and the active layer, and a second optical guide layer and a spacer layer are formed between the active layer and the diffraction grating layer.

3. The method of manufacturing semiconductor laser device according to claim 1,
    wherein the diffraction grating layer is a III-V family compound semiconductor layer including at least one of In, Ga, As, and P elements.

* * * * *